United States Patent
Lee

(10) Patent No.: US 7,026,185 B2
(45) Date of Patent: Apr. 11, 2006

(54) METHODS OF FABRICATING IMAGE SENSORS INCLUDING LOCAL INTERCONNECTIONS

(75) Inventor: Seok-Ha Lee, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 11/095,385

(22) Filed: Mar. 31, 2005

(65) Prior Publication Data

US 2005/0196889 A1   Sep. 8, 2005

Related U.S. Application Data

(62) Division of application No. 10/442,418, filed on May 21, 2003, now Pat. No. 6,963,092.

(30) Foreign Application Priority Data

Jun. 17, 2002   (KR) ............... 2002-0033639

(51) Int. Cl.
*H01L 29/04* (2006.01)

(52) U.S. Cl. .................. 438/60; 438/75; 438/78; 438/79

(58) Field of Classification Search .............. 438/48, 438/75, 80, 59–60, 79, 57; 257/223, 230, 257/445, 290–293, E27.132, E27.133, E27.145, 257/E27.162, E27.139
See application file for complete search history.

(56) References Cited

U.S. PATENT DOCUMENTS

| 618,405 | A | 1/1899 | Erstad |
|---|---|---|---|
| 5,172,249 | A | 12/1992 | Hashimoto |
| 5,349,215 | A | 9/1994 | Anagnostopoulos et al. |
| 5,585,298 | A | 12/1996 | Stevens et al. |
| 5,608,243 | A | 3/1997 | Chi et al. |
| 5,623,306 | A | 4/1997 | Kajihara et al. |
| 5,702,971 | A | 12/1997 | Stevens |
| 5,710,446 | A | 1/1998 | Chi et al. |
| 5,804,844 | A | 9/1998 | Anagnostopoulos |
| 5,867,215 | A | 2/1999 | Kaplan |
| 5,886,659 | A | 3/1999 | Pain et al. |
| 5,942,774 | A | 8/1999 | Isogai et al. |
| 5,952,686 | A | 9/1999 | Chou et al. |
| 6,023,293 | A * | 2/2000 | Watanabe et al. ........... 348/294 |
| 6,051,447 | A | 4/2000 | Lee et al. |
| 6,051,852 | A | 4/2000 | Stevens |
| 6,169,318 | B1 | 1/2001 | McGrath |
| 6,201,270 | B1 | 3/2001 | Chen |
| 6,259,124 | B1 | 7/2001 | Guidash |
| 6,303,421 | B1 * | 10/2001 | Chang ................... 438/228 |

(Continued)

FOREIGN PATENT DOCUMENTS

KR    2002-39374    5/2002

OTHER PUBLICATIONS

Office Action, Korean Application No. 2003-29877, Apr. 30, 2004.

*Primary Examiner*—Long Pham
*Assistant Examiner*—Thao X. Le
(74) *Attorney, Agent, or Firm*—Myers Bigel Sibley & Sajovec

(57) ABSTRACT

A pixel of a semiconductor-based image detector includes a photodetector, at least one switching device serially connected to the photodetector and a bypass device interposed between the photodetector and a power supply voltage. Accordingly, even though excess charges may be generated in the photodetector, the excess charges flow into the power supply through the bypass device. Blooming can thereby be reduced or suppressed.

5 Claims, 10 Drawing Sheets

U.S. PATENT DOCUMENTS

| | | |
|---|---|---|
| 6,320,617 B1 | 11/2001 | Gee et al. |
| 6,326,230 B1 | 12/2001 | Pain et al. |
| 6,362,019 B1 * | 3/2002 | Kuriyama .................... 438/60 |
| 6,483,163 B1 | 11/2002 | Isogai et al. |
| 6,528,342 B1 * | 3/2003 | Miyagawa et al. ........... 438/79 |
| 6,566,697 B1 | 5/2003 | Fox et al. |
| 6,587,142 B1 | 7/2003 | Kozlowski et al. |
| 6,606,122 B1 | 8/2003 | Shaw et al. |
| 6,610,557 B1 * | 8/2003 | Lee et al. .................... 438/87 |
| 6,624,456 B1 | 9/2003 | Fossum et al. |
| 6,690,000 B1 | 2/2004 | Muramatsu et al. |
| 6,704,050 B1 | 3/2004 | Washkurak et al. |
| 6,710,804 B1 | 3/2004 | Guidash |
| 6,730,914 B1 * | 5/2004 | Chao et al. ............ 250/370.14 |
| 6,767,759 B1 * | 7/2004 | Rhodes ........................ 438/60 |
| 6,784,934 B1 | 8/2004 | Watanabe |
| 6,909,126 B1 * | 6/2005 | Janesick .................... 257/184 |

* cited by examiner

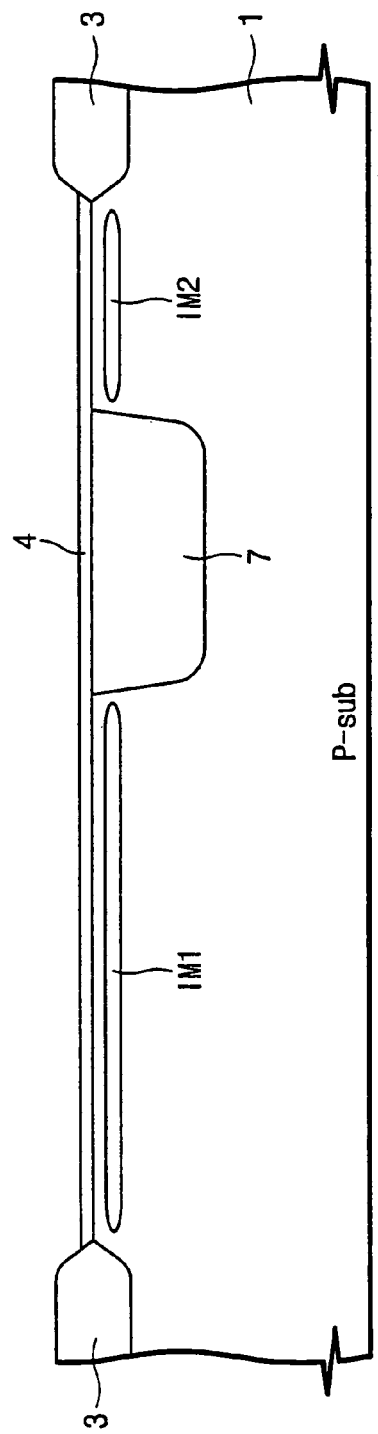
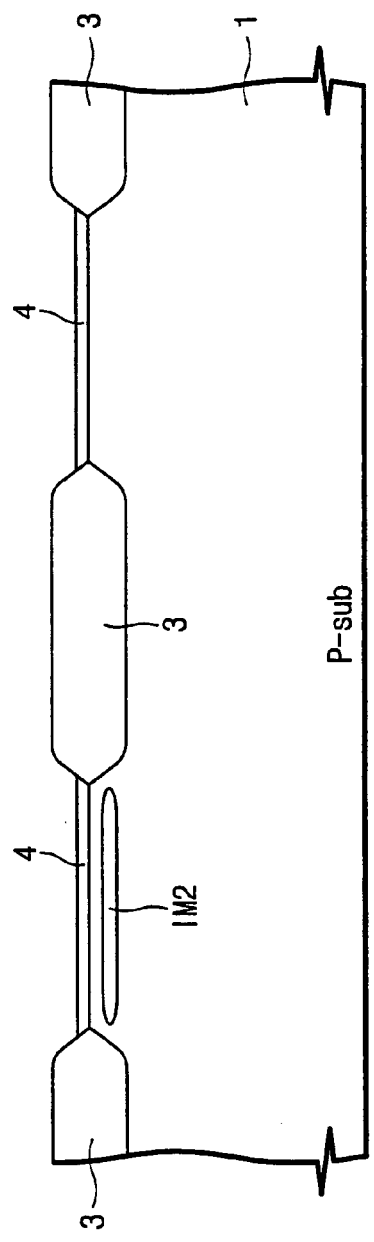

# METHODS OF FABRICATING IMAGE SENSORS INCLUDING LOCAL INTERCONNECTIONS

RELATED APPLICATION

This application is a divisional of application Ser. No. 10/442,418, filed May 21, 2003 now U.S. Pat. No. 6,963,092, entitled Image Sensor Including Photodetector and Bypass Device Connected to a Power Supply Voltage, and Methods of Fabricating Same, and claims the benefit of Korean Patent Application No. 2002-0033639, filed Jun. 17, 2002, the disclosure of which is hereby incorporated herein by reference in its entirety as if set forth fully herein.

FIELD OF THE INVENTION

The present invention relates to semiconductor devices and fabrication methods thereof, and more particularly to semiconductor-based image sensors and fabrication methods thereof.

BACKGROUND OF THE INVENTION

Solid-state (semiconductor-based) image sensors are widely used in cameras or the like. A solid-state image sensor includes a plurality of pixels, which may be two dimensionally arrayed. The pixels employ a photodetector such as a photo diode, Charge Coupled Device (CCD) and/or other photodetectors.

Solid-state image sensors may suffer from a problem that is known as "blooming." Blooming is a phenomenon that occurs when the number of charge carriers generated in a pixel by the incident light exceeds the charge storage capacity of the pixel. These excess charges may be injected into an adjacent pixel or an adjacent active region, which can degrade performance of the image sensor.

An antiblooming structure for a solid state image sensor is described in U.S. Pat. No. 5,349,215 to Anagnostopoulos et al., entitled *Antiblooming Structure For Solid-State Image Sensor*. As described therein, solid-state image sensors, in general, comprise a photodetector for detecting radiation from the image and converting the radiation to charge carriers, and transfer means for carrying the charge carriers to an output circuit. One type of solid-state image sensor uses a CCD as both the photodetector and the transfer means. The solid-state image sensor generally includes a plurality of the CCD's arranged in spaced parallel relation to form an array. The image sensor of this disclosure utilizes only one antiblooming lateral overflow barrier. The excess signal charge of phase 1 flows into the preceding phase 2 and is saved. This eliminates the overflow barrier of phase 1 so that blooming protection is via the overflow barrier of the preceding phase 2. This results in an image sensor with blooming protection and increased charge capacity. Antiblooming techniques are also described in also U.S. Pat. Nos. 6,259,124; 6,051,852; 5,867,215; 5,804,844; 5,702,971; and 5,585,298.

SUMMARY OF THE INVENTION

Semiconductor-based image sensors according to some embodiments of the invention include at least one pixel that comprises a photodetector, at least one switching device serially connected to the photodetector and a bypass device connected to the photodetector. The bypass device has two terminals, which are connected to the photodetector and a power supply voltage terminal (also simply referred to as a power supply voltage), respectively. In some embodiments, the photodetector is a photo diode.

In some embodiments, the at least one switching device comprises a transfer transistor, a reset transistor, a sensing transistor and a pull-up transistor, which are serially connected to the photodetector. A first node between the transfer transistor and the reset transistor is electrically connected to the gate electrode of the sensing transistor, and a second node between the reset transistor and the sensing transistor is electrically connected to the power supply voltage. In addition, the gate electrode of the reset transistor is electrically connected to a reset line. Also, the gate electrode of the transfer transistor is electrically connected to a transfer line. Further, the gate electrode of the pull-up transistor is electrically connected to a word line.

In some embodiments, the bypass device is a resistor. In some embodiments, the potential barrier between the photodetector and the resistor is lower than the potential barrier between the photodetector and the switching device.

In other embodiments, the bypass device may be an insulated gate field effect transistor, referred to herein as a metal-oxide-semiconductor (MOS) transistor, having a dummy gate electrode. The source region and the drain region of the MOS transistor are connected to the photodetector and the power supply voltage, respectively. The dummy gate electrode may be floated or grounded.

Semiconductor-based image sensors according to other embodiments of the invention include at least one pixel that includes an isolation layer in a semiconductor substrate to define an active region. The active region comprises a first active region, a second active region that extends from the first active region and a third active region that extends from the first active region. In some embodiments, the third active region is connected to another second active region in an adjacent pixel. A photodetector is in the first active region. At least one switching device is in the second active region. Also, a bypass device is in the third active region.

In some embodiments, the photodetector is a photo diode that includes a region of a first conductivity type at a surface of the first active region and a well region of a second conductivity type surrounding a bottom and sidewalls of the first conductivity type region. The first and second conductivity types may be P-type and N-type respectively, or vice-versa.

In some embodiments, the at least one switching device comprises a transfer transistor, a reset transistor, a sensing transistor and a pull-up transistor, which are serially connected in the second active region. In some embodiments, the pull-up transistor has a pull-up gate electrode that crosses over the second active region, and the transfer transistor has a transfer gate electrode that crosses over the second active region between the pull-up gate electrode and the first active region. The transfer gate electrode is disposed adjacent the first active region.

In some embodiments, the reset transistor has a reset gate electrode that crosses over the second active region between the transfer gate electrode and the pull-up gate electrode, and the sensing transistor has a sensing gate electrode that is disposed across the second active region between the pull-up gate electrode and the reset gate electrode. The sensing gate electrode is electrically connected to the second active region between the transfer gate electrode and the reset gate electrode through a first local interconnection. In addition, the third active region is connected to a second active region in another pixel, which is adjacent to the third active region. In some embodiments, the third active region is connected to the second active region between a reset gate electrode and a sensing gate electrode in the adjacent pixel.

In some embodiments, the bypass device is a resistor in the third active region. In some embodiments, a potential barrier between the photodetector and the resistor is lower than a potential barrier between the photodetector and the transfer transistor.

In other embodiments, the bypass device is a MOS transistor. The MOS transistor comprises a dummy gate electrode that crosses over the third active region. The dummy gate electrode may be floated or grounded.

According to still other embodiments of the present invention, methods are provided for fabricating at least one pixel of a semiconductor-based image sensor. An isolation layer is formed in a semiconductor substrate. The isolation layer defines a first active region, a second active region that extends from the first active region, and a third active region that extends from the first active region. In some embodiments, the third active region is connected to a second active region in a neighboring pixel, which is adjacent to the first active region. A well region of a second conductivity type is formed at the first active region. A region of a first conductivity type is formed in the well region, at the surface of the first active region.

A transfer transistor, a reset transistor, a sensing transistor and a pull-up transistor, which are serially connected to the well region, are formed in the second active region. The transfer transistor is formed adjacent the first active region. The transfer transistor, the reset transistor, the sensing transistor and the pull-up transistor have a transfer gate electrode, a reset gate electrode, a sensing gate electrode and a pull-up gate electrode, respectively. The transfer gate electrode, the reset gate electrode, the sensing gate electrode and the pull-up gate electrode are formed across the second active region. In some embodiments, the third active region is connected to a second active region between a reset gate electrode and a sensing gate electrode formed in the adjacent pixel.

An interlayer insulation layer is formed on the substrate including on the transfer transistor, the reset transistor, the sensing transistor and the pull-up transistor. The interlayer insulation layer is patterned to form contact holes that expose the second active region between the transfer gate electrode and the reset gate electrode as well as the sensing gate electrode. A first local interconnection is formed on the interlayer insulation layer. The first local interconnection electrically connects the sensing gate electrode with the second active region between the transfer gate electrode and the reset gate electrode through the contact holes.

In some embodiments, the first and second conductivity types are P-type and N-type respectively. In this case, the transfer transistor, the reset transistor, the sensing transistor and the pull-up transistor are preferably N-channel MOS transistors.

In other embodiments, a first ion implantation process and a second ion implantation process may be applied to the surfaces of the second active region and the third active region respectively, prior to formation of the transfer transistor, the reset transistor, the sensing transistor and the pull-up transistor. In some embodiments, the second active region that is formed with the first ion implantation process has a potential barrier, which is higher than that of the third active region that is formed with the second ion implantation process.

In other embodiments, a dummy gate electrode is formed across the third active region during formation of the transfer gate electrode, the reset gate electrode, the sensing gate electrode and the pull-up gate electrode. Further, a fourth active region, which is spaced apart from the first to third active regions, may be additionally defined during formation of the isolation layer. In some embodiments, the fourth active region is doped with P-type impurities, thereby acting as a pick-up region connected to a ground terminal. The dummy gate electrode and the fourth active region are exposed during formation of the contact holes. The exposed dummy gate electrode and the exposed fourth active region are electrically connected to each other through a second local interconnection. The second local interconnection is formed during formation of the first local interconnection.

BRIEF DESCRIPTION OF THE DRAWINGS

FIGS. 5A to 7A are cross sectional views, taken along the line I—I of FIG. 2, illustrating methods of fabricating pixels according to embodiments of the present invention; and FIGS. 5B to 7B are cross sectional views, taken along the line II—II of FIG. 2, illustrating methods of fabricating pixels according to embodiments of the present invention.

DETAILED DESCRIPTION OF PREFERRED EMBODIMENTS

Figure 1:
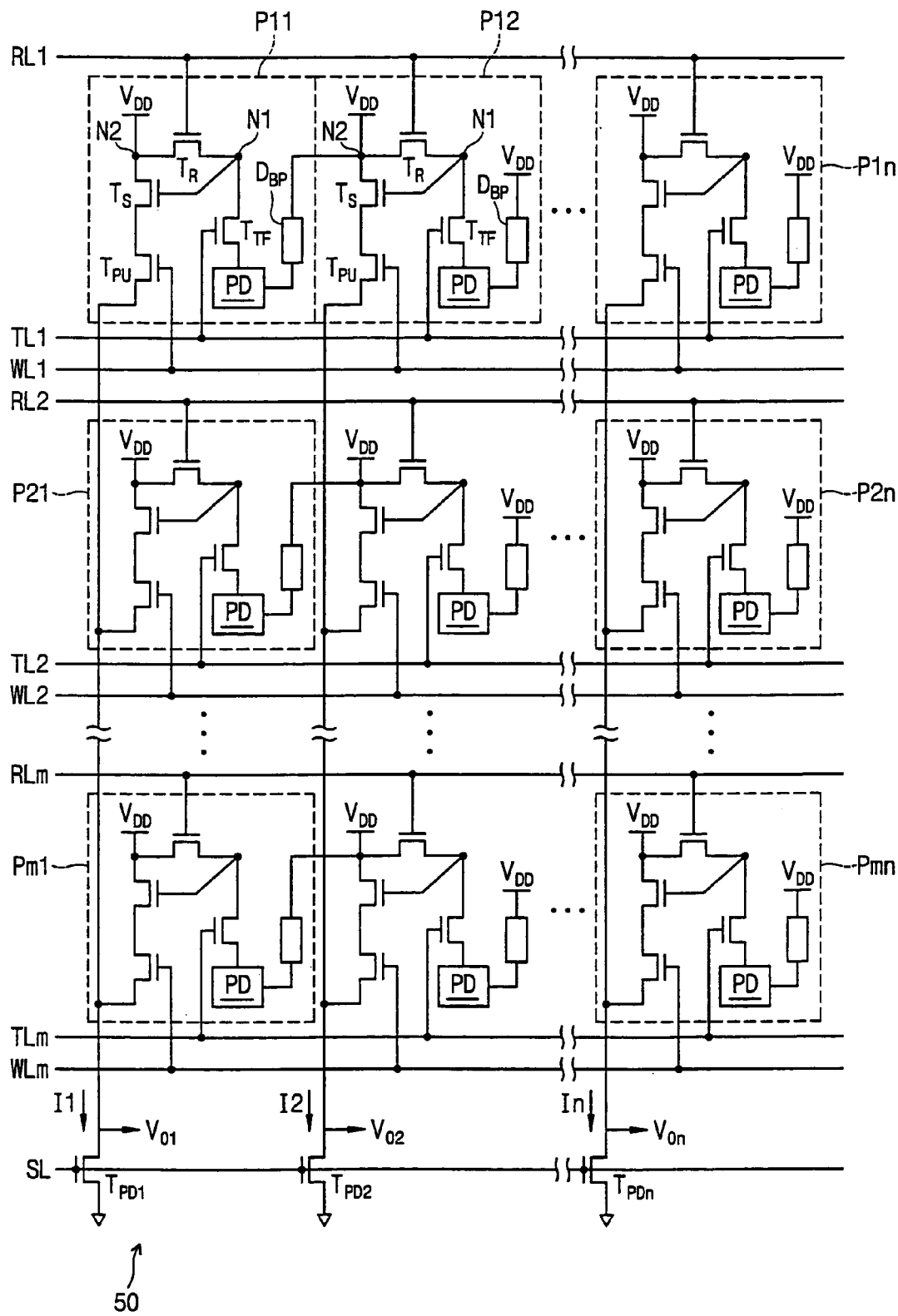
FIG. 1 is an equivalent circuit diagram of a pixel array region according to embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is an equivalent circuit diagram of a semiconductor-based image sensor according to embodiments of the present invention. The semiconductor-based image sensor includes at least one pixel in a region that may be referred to as a pixel array region.

Referring to FIG. 1, the pixel array region 50 comprises a plurality of pixels P11, P12, ..., P1n, ..., Pm1, ..., Pmn, which, in some embodiments, are two dimensionally arrayed along rows and columns. In other embodiments, a one-dimensional array or a single pixel may be provided. In some embodiments, each of the pixels includes a photodetector PD. A photo diode and/or other photosensitive element may be employed as a photodetector PD. The photo diode has a P-type region and an N-type region. If an incident light ray is irradiated on the photo diode, holes and electrons are generated in the P-type region and the N-type region respectively.

The photodetector PD is connected to a switching device. The switching device may comprise a transfer transistor $T_{TF}$, a reset transistor $T_R$, a sensing transistor $T_S$ and a pull-up transistor $T_{PU}$, which are serially connected to the photodetector PD. A first node N1 between the transfer transistor $T_{TF}$ and the reset transistor $T_R$ is connected to a gate electrode of the sensing transistor $T_S$. Also, a second node N2 between the reset transistor $T_R$ and the sensing transistor $T_S$ is connected to a power supply voltage $V_{DD}$. In the event that the photodetector PD is a photo diode, in some embodiments the transfer transistor $T_{TF}$, the reset transistor $T_R$, the sensing transistor $T_S$ and the pull-up transistor $T_{PU}$ are NMOS transistors. In this case, the transfer transistor $T_{TF}$ is connected to the N-type region of the photo diode. That is, the N-type region of the photo diode corresponds to a source region of the transfer transistor $T_{TF}$.

In addition, the photodetector PD is connected to one terminal of a bypass device $D_{BP}$. The other terminal of the bypass device $D_{BP}$ is connected to the power supply voltage $V_{DD}$. As a result, two pixels, which are adjacent to each other in rows, are also connected through the bypass device $D_{BP}$ as shown in FIG. 1. For example, the photodetector PD of the first pixel P11 is connected to the second node N2 of the second pixel P12 that is adjacent to the first pixel P11, through the bypass device $D_{BP}$.

The bypass device $D_{BP}$ may be a resistor. The resistor may be doped with P-type dopants. In this case, in some embodiments one terminal of the resistor is connected to the N-type region of the photo diode and the other terminal of the resistor is connected to the power supply voltage $V_{DD}$. In some embodiments, the potential barrier between the N-type region and the P-type resistor is lower than the potential barrier between the N-type region and a channel region of the transfer transistor $T_{TF}$. This can reduce or prevent excess charges generated in the photodetector PD from being injected into the first node N1 through the channel of the transfer transistor $T_{TF}$. In other words, it can reduce or prevent excess electrons generated in the N-type region of the photo diode due to incident light from flowing into the first node N1 through the channel region of the transfer transistor $T_{TF}$.

In other embodiments, the bypass device $D_{BP}$ may be an NMOS transistor having a dummy gate electrode. In this case, a source region of the bypass NMOS transistor is connected to the N-type region of the photo diode, and a drain region of the bypass NMOS transistor is connected to the power supply voltage $V_{DD}$. Also, the dummy gate electrode may be floated, grounded or tied to some other potential. In some embodiments, the potential barrier between the N-type region of the photo diode and the channel region of the bypass NMOS transistor is lower than the potential barrier between the N-type region of the photo diode and the channel region of the transfer transistor $T_{TF}$. In other words, the threshold voltage of the bypass NMOS transistor is preferably lower than that of the transfer transistor $T_{TF}$. Accordingly, even though excess electrons are generated in the N-type region of the photo diode due to the incident light, the excess electrons flow into the power supply voltage $V_{DD}$ through the bypass NMOS transistor. As a result, the sensing transistor $T_S$ is not turned on. Therefore, it is possible to reduce or suppress the "blooming" phenomenon and/or malfunction of the image sensor, which may be due to the excess electrons.

In some embodiments, N-number of pixels P11, P12, ..., P1n, which are arrayed in the first row, are connected to a first reset line RL1, a first transfer line TL1 and a first word line WL1 that are parallel with the first row. In detail, gate electrodes of the transfer transistors $T_{TF}$ arrayed in the first row are connected to the first transfer line TL1, and gate electrodes of the reset transistors $T_S$ arrayed in the first row are connected to the first reset line RL1. Also, gate electrodes of the pull-up transistors $T_{PU}$ arrayed in the first row are connected to the first word line WL1. Similarly, n-number of pixels P21, P22, ..., P2n, which are arrayed in the second row, are connected to a second reset line RL2, a second transfer line TL2 and a second word line WL2, and n-number of pixels Pm1, Pm2, ..., Pmn, which are arrayed in the m-th row, are connected to an m-th reset line RLm, an m-th transfer line TLm and an m-th word line WLm.

In addition, in some embodiments, m-number of pixels P11, P21, ..., Pm1, which are arrayed in the first column, are connected to a first pull down transistor $T_{PD1}$. In detail, source regions of the pull-up transistors $T_{PU}$ in the first column are connected to a drain region of the first pull down transistor $T_{PD1}$. Similarly, source regions of the pull-up transistors $T_{PU}$ in the second column are connected to a drain region of a second pull down transistor $T_{PD2}$, and source regions of the pull-up transistors $T_{PU}$ in the $n^{th}$ column are connected to a drain region of an $n^{th}$ pull down transistor $T_{PDn}$. The source regions and the gate electrodes of the pull down transistors $T_{PD1}, T_{PD2}, ..., T_{PDn}$ are connected to a ground terminal and a selection line SL respectively.

Methods of outputting data in the pixels shown in FIG. 1 will be described. Referring to FIG. 1 again, a voltage corresponding to logic "1" is applied to the plurality of reset lines RL1, RL2, ..., RLm to turn on all of the reset transistors $T_R$. As a result, all of charges that exist in the first nodes N1 are removed. Therefore, all of the pixels are initialized. The reset transistors $T_R$ are then turned off. If incident light is irradiated on the initialized pixels, charges are generated in the photodetectors PD due to the incident light. In the event that the photodetectors are photo diodes and the transfer transistors $T_{TF}$, the reset transistors $T_R$, the sensing transistors $T_S$ and the pull-up transistors $T_{PU}$ are NMOS transistors, electrons are generated in the N-type regions of the photo diodes.

A voltage corresponding to logic "1" is applied to the first transfer line TL1, the first word line WL1 and the selection line SL in order to output the data of the pixels P11, ..., P1n in the first row. As a result, the n-number of pull down transistors $T_{PD1}, ..., T_{PDn}$ as well as the transfer transistors $T_{TF}$ and the pull-up transistors $T_{PU}$ in the first row are turned on. Thus, the electrons in the N-type impurity regions of the photo diodes in the first row are injected into the first nodes N1 of the pixels in the first row, and driving abilities of the sensing transistors $T_S$ are determined according to amount of the electrons injected into the first nodes N1. As a result, a first to an $n^{th}$ currents I1, ..., In flow through the sensing transistors $T_S$ in the first row respectively, and the first to $n^{th}$ currents I1, ..., In flow to the ground terminal through the first to $n^{th}$ pull down transistors $T_{PD1}, ..., T_{PDn}$ respectively.

Therefore, a first to an $n^{th}$ output voltages $V_{O1}, \ldots, V_{On}$ are induced at the drain regions of the pull down transistors $T_{PD1}, \ldots, T_{PDn}$ respectively. Magnitudes of the first to $n^{th}$ output voltages $V_{O1}, \ldots, V_{On}$ are determined according to the amount of the first to $n^{th}$ currents I1, ..., In. The first to $n^{th}$ output voltages $V_{O1}, \ldots, V_{On}$ correspond to the data of the first to $n^{th}$ pixels in the first row respectively.

Similarly, a voltage corresponding to logic "1" can be applied to the second transfer line TL2, the second word line WL2 and the selection line SL in order to output the data of the pixels P21, ..., P2n in the second row. Thus, the data of all pixels in the pixel array region 50 can be output using the above method.

According to embodiments of the invention, even though excess electrons are generated in at least one of the photo diodes, blooming and/or malfunction can be reduced or prevented. For example, in the event that the excess electrons are generated in the photo diode of the first pixel P11, the excess electrons flow into the power supply voltage $V_{DD}$ through the bypass device $D_{BP}$ in the first pixel P11. Accordingly, embodiments of the invention can reduce or prevent the excess electrons in the photo diode of the first pixel P11 from flowing into the first node N1 in the first pixel P11 or into the photo diode and the first node N1 of the other pixel (P12 or P21) adjacent to the first pixel P11.

Figure 2:
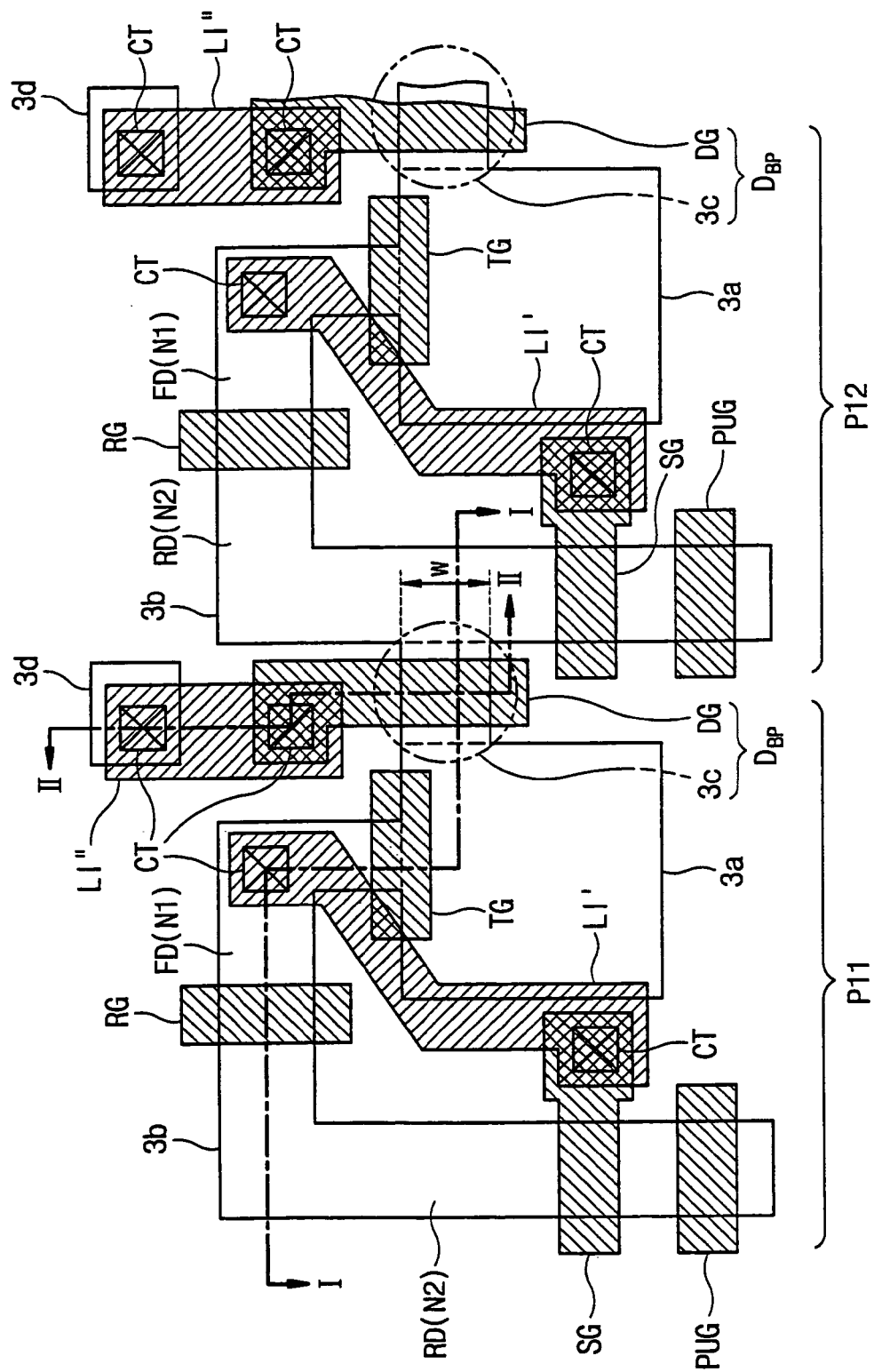
FIG. 2 is a top plan view showing a portion of a pixel array region according to embodiments of the present invention.
Figure 3A:
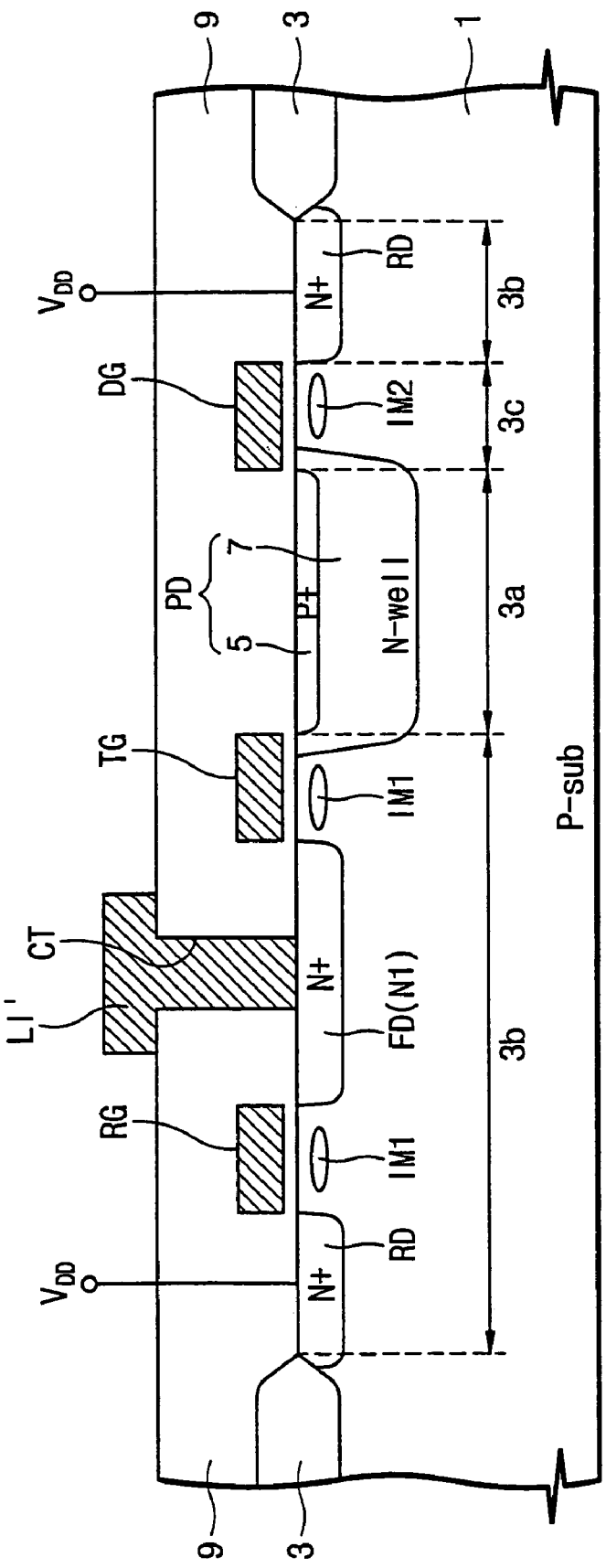
FIG. 3A is a cross sectional view taken along the line I—I of FIG. 2.
Figure 3B:
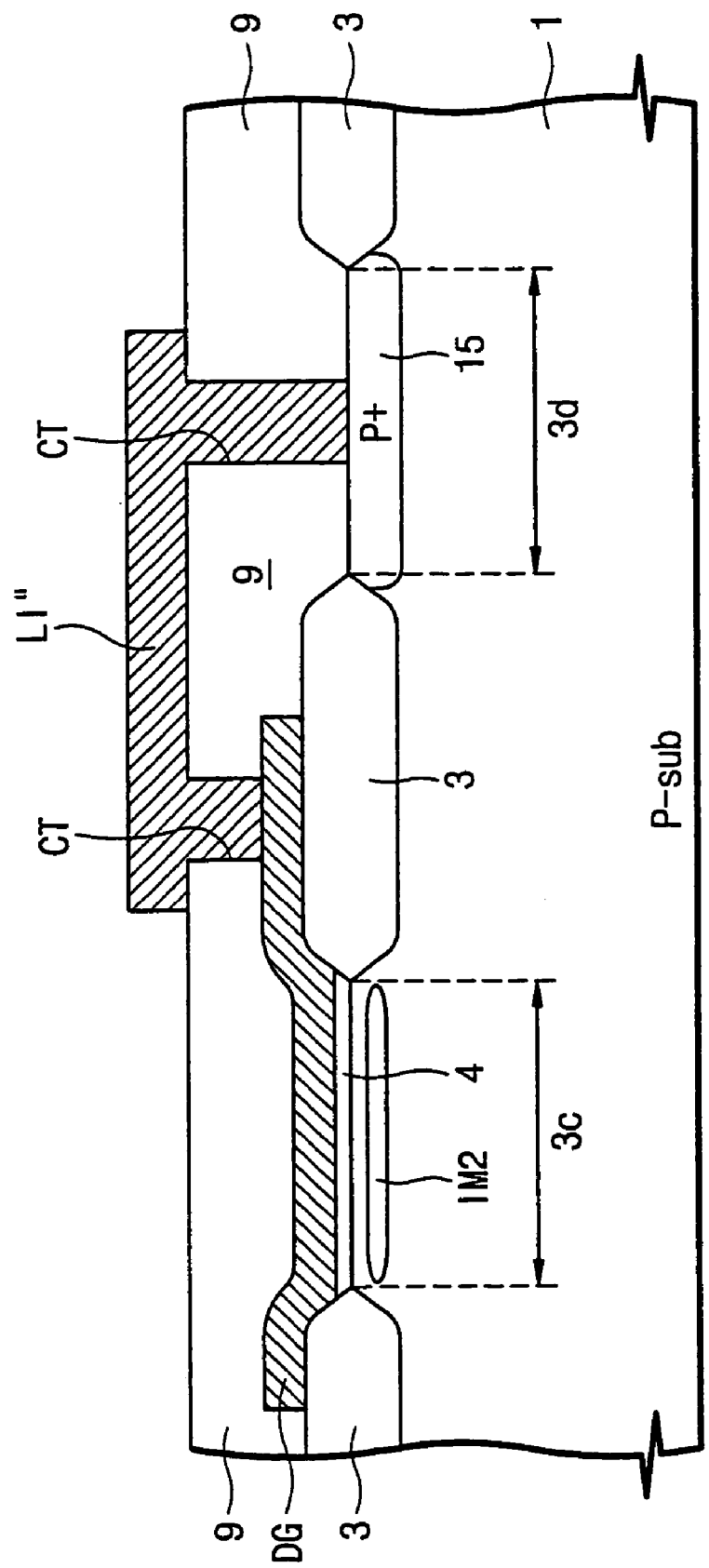
FIG. 3B is a cross sectional view taken along the line II—II of FIG. 2.

FIG. 2 is a top plan view showing a portion of a pixel array region according to embodiments of the present invention. Also, FIG. 3A is a cross sectional view taken along the line I—I of FIG. 2, and FIG. 3B is a cross sectional view taken along the line II—II of FIG. 2. Here, FIG. 2 illustrates a top plan view of the pair of pixels P11 and P12, for example as shown in FIG. 1. A structure of the pixel array region according to some embodiments of the present invention will now be described with reference to FIGS. 2, 3A and 3B.

Referring to FIGS. 2, 3A and 3B, an isolation layer 3 is disposed at a predetermined region of a semiconductor substrate 1 of a first conductivity type, e.g., a P-type semiconductor substrate. The isolation layer 3 defines a first to a third active regions 3a, 3b and 3c in each of the pixel regions. The second active region 3b extends from the first active region 3a, and the third active region 3c also extends from the first active region 3a.

A photodetector PD such as a photo diode is formed in the first active region 3a. In detail, a well region 7 of a second conductivity type, e.g., an N-well region is formed at the first active region 3a. In addition, a region 5 of a first conductivity type, e.g., a P-type region is formed at the surface of the N-well region 7. As a result, the well region 7 surrounds the sidewall and the bottom of the impurity region 5. The impurity region 5 and the well region 7 constitute a photo diode. At least one switching device is disposed at the second active region 3b. The at least one switching device may comprises a transfer transistor (e.g., $T_{TF}$ of FIG. 1), a reset transistor (e.g., $T_R$ of FIG. 1), a sensing transistor (e.g., $T_S$ of FIG. 1) and a pull-up transistor (e.g., $T_{PU}$ of FIG. 1), which are formed in the second active region 3b.

The transfer transistor includes a transfer gate electrode TG that crosses over the second active region 3b, and the transfer gate electrode TG is disposed adjacent the first active region 3a. Similarly, the pull-up transistor includes a pull-up gate electrode PUG that crosses over the second active region 3b. The reset transistor includes a reset gate electrode RG that crosses over the second active region 3b between the transfer gate electrode TG and the pull-up gate electrode PUG, and the sensing transistor includes a sensing gate electrode SG that crosses over the second active region between the reset gate electrode RG and the pull-up gate electrode PUG.

The N-well region 7 acts as a source region of the transfer transistor. Also, the second active region that forms gate electrodes TG, RG, SG and PUG is doped with N-type dopants. As a result, the transfer transistor, the reset transistor, the sensing transistor and the pull-up transistor are NMOS transistors. However, in other embodiments, the first conductivity type and the second conductivity type may be an N-type and a P-type respectively. In this case, the photo diode is composed of a P-well region formed at the first active region 3a and an N-type impurity region surrounded by the P-well region, and the transfer transistor, the reset transistor, the sensing transistor and the pull-up transistor are all PMOS transistors. For the purpose of ease and convenience in explanation of the embodiments to be described hereinafter, it is considered only that the first and second conductivity types are P-type and N-type respectively.

The second active region 3b between the transfer gate electrode TG and the reset gate electrode RG corresponds to a floating diffusion region FD (the first node N1 of FIG. 1). Also, the second active region 3b between the reset gate electrode RG and the sensing gate electrode SG corresponds to a reset diffusion region RD (the second node N2 of FIG. 1). The reset diffusion region RD is electrically connected to a power supply voltage $V_{DD}$. The third active region 3c in the first pixel P11 is connected to another second active region 3b in the second pixel P12, which is adjacent to the first pixel P11. In more detail, the third active region 3c in the first pixel P11 is connected to another reset diffusion region RD in the second pixel P12.

A bypass device ($D_{BP}$ of FIG. 1) is formed at the third active region 3c. In some embodiments, the bypass device $D_{BP}$ is an NMOS transistor as shown in FIGS. 2, 3A and 3B. In other embodiments, the bypass device $D_{BP}$ may be a resistor formed at the third active region 3c. In the event that the bypass device is the NMOS transistor, a dummy gate electrode DG is disposed across the third active region 3c. Thus, the N-well region 7 of the photo diode acts as a source region of the bypass NMOS transistor, and the reset diffusion region RD connected to the third active region 3c acts as a drain region of the bypass NMOS transistor. The dummy gate electrode DG may be floated, grounded or connected to another potential. In order to ground the dummy gate electrode DG, each of the pixels may further comprise a fourth active region 3d, which is spaced apart from the first to third active regions 3a, 3b and 3c. The fourth active region 3d is doped P-type and is connected to a ground terminal. As a result, the fourth active region 3d acts as a P-type pick-up region.

In some embodiments, doping of a channel region of the transfer transistor can be controlled using at least a first ion implantation process IM1. In addition, doping of the third active region 3c can be controlled using a second ion implantation process IM2. The first and second ion implantation processes IM1 and IM2 are performed in some embodiments so that a potential barrier between the N-well region 7 and the third active region 3c is lower than a potential barrier between the N-well region 7 and the transfer channel region.

The substrate having the transistors is covered with an interlayer insulation layer 9. The floating diffusion region FD and the sensing gate electrode SG are exposed by contact holes CT that pass through the interlayer insulation layer 9. In the event that each of the pixels comprises the pick-up region 3d and the dummy gate electrode DG, then the dummy gate electrode DG and the pick-up region 3d may also be exposed by additional contact holes CT that pass through the interlayer insulation layer 9. A first and a second local interconnection LI' and LI" are disposed on the interlayer insulation layer 9. The first local interconnection LI' electrically connects the sensing gate electrode SG with the floating diffusion region FD through the contact holes CT, and the second local interconnection LI" electrically connects the dummy gate electrode DG with the pick-up region 3d through the contact holes CT. If the dummy gate electrode DG is grounded, it is possible to stabilize the operation of the bypass NMOS transistor.

Figure 4A:
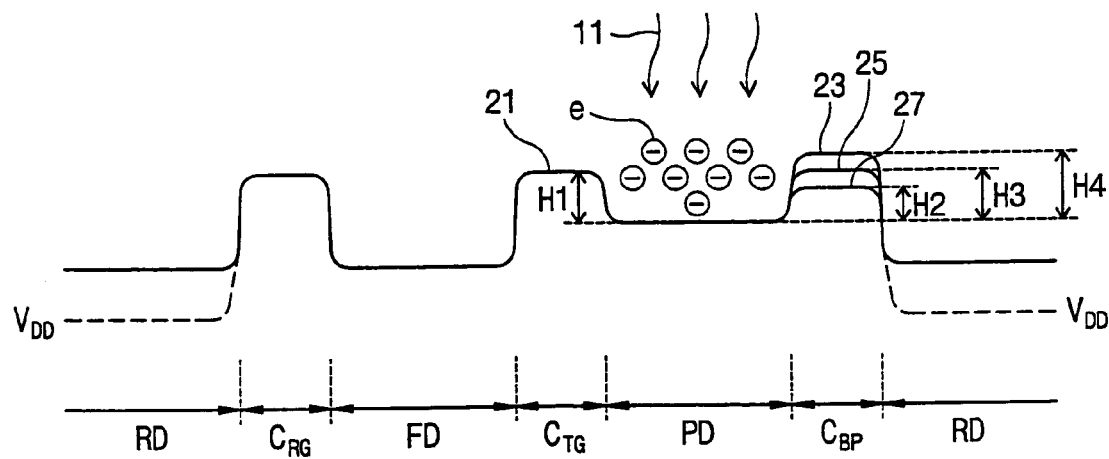
FIG. 4A is a diagram showing a potential level with respect to electrons along the line I—I of FIG. 2.
Figure 4B:
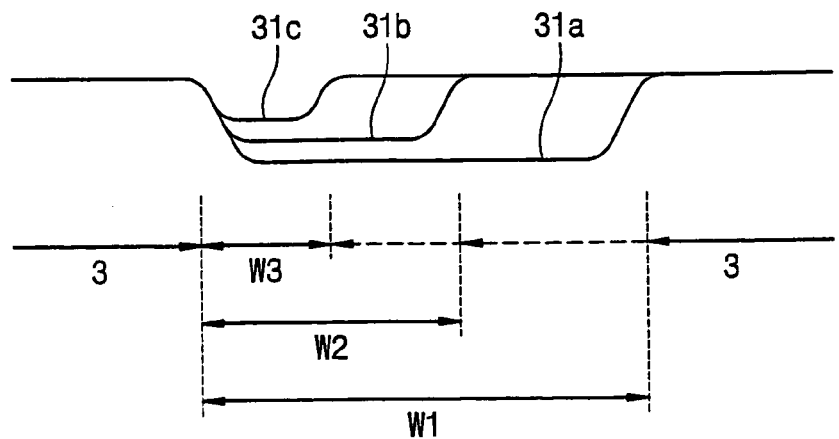
FIG. 4B is a diagram showing a potential level with respect to electrons along the line II—II of FIG. 2.

FIG. 4A is an energy band diagram, taken along the line I—I of FIG. 1, showing potential levels with respect to electrons, and FIG. 4B is an energy band diagram, taken along the line II—II of FIG. 1, showing the potential levels with respect to electrons. In FIG. 4A, solid lines indicate the potential levels under an equilibrium state without any external electrical bias, and dashed lines indicates the potential levels with respect to the case that the power supply voltage $V_{DD}$ is applied to the reset diffusion region RD.

Referring to FIGS. 4A and 4B, if incident light 11 is irradiated on the photo diode PD, electrons are generated in the N-well region (7 of FIG. 3A) of the photo diode PD. Under the equilibrium state, the transfer channel region $C_{TG}$ has a first potential barrier height H1 with respect to the N-well region 7. Also, the third active region 3c, e.g., a bypass channel region $C_{BP}$ has a second potential barrier height H2, a third potential barrier height H3 or a fourth potential barrier height H4 with respect to the N-well region 7. A potential level of the transfer channel region $C_{TG}$, e.g., a first potential level 21 is related to a doping concentration of the transfer channel region $C_{TG}$. Similarly, a potential level of the bypass channel region $C_{BP}$, e.g., a second potential level 23, a third potential level 25 or a fourth potential level 27 is related to a doping concentration of the bypass channel region $C_{BP}$ (refer to FIG. 4A). In addition, a potential level 31a, 31b or 31c of the third active region 3c may be subject to a width W1, W2 or W3 of the third active region 3c (refer to FIG. 4B). That is to say, in the event that the doping concentration (P-type concentration) of the third active region 3c increases, the potential barrier height of the third active region 3c increases. Also, in the event that the width W1, W2 or W3 of the third active region 3c decreases, the potential barrier height of the third active region 3c increases. Accordingly, it is possible to control the final potential barrier height of the third active region 3c, e.g., the bypass device $D_{BP}$, to a desired value by appropriately designing the doping concentration and/or the width of the third active region 3c.

In FIG. 4A, the second potential level 23 is higher than the first potential level 21, and the third potential level 25 is equal to the first potential level 21. Also, the fourth potential level 27 is lower than the first potential level 21. In this case, in some embodiments, the third active region 3c (i.e., the bypass channel region $C_{BP}$) has the fourth potential level 27, which is lower than the first potential level 21 of the transfer channel region $C_{TG}$. This is because excess electrons generated in the N-well region 7 can be bypassed into the power supply through the third active region 3c connected to the N-well region 7 without any flow into the floated diffusion region FD. As a result, it can reduce or prevent the blooming phenomenon.

FIGS. 5A to 7A are cross sectional views, taken along the line I—I of FIG. 2, illustrating methods of fabricating a pixel array region according to embodiments of the present invention. FIGS. 5B to 7B are cross sectional views, taken along the line II—II of FIG. 2, illustrating methods of fabricating a pixel array region according to embodiments of the present invention.

Referring to FIGS. 2, 5A and 5B, an isolation layer 3 is formed in a predetermined region of a semiconductor substrate of a first conductivity type, for example, a P-type semiconductor substrate. The isolation layer 3 defines a first active region, a second active region and a third active region (3a, 3b and 3c of FIG. 2) in the respective pixel regions. In addition, the isolation layer 3 may further define a fourth active region (3d of FIG. 2), which is spaced apart from the first to third active regions 3a, 3b and 3c, in the respective pixel regions. The second active region 3b extends from the first active region 3a. The third active region 3c is also extended from the first active region 3a.

Ions of a second conductivity type, e.g., N-type ions, are selectively implanted into the first active region 3a to form an N-well region 7. Further, first ions may be implanted into the second active region 3b using a first implantation process IM1. The first implantation process IM1 is performed in order to adjust a threshold voltage of MOS transistors to be formed at the second active region 3b in a subsequent process. In addition, second ions may be implanted into the third active region 3c using a second implantation process IM2. The first and second ions may be P-type ions. In this case, in some embodiments, a dose of the second ions is lower than that of the first ions. A gate insulation layer 4 is formed on the first to fourth active regions 3a, 3b, 3c and 3d.

Figure 6A:
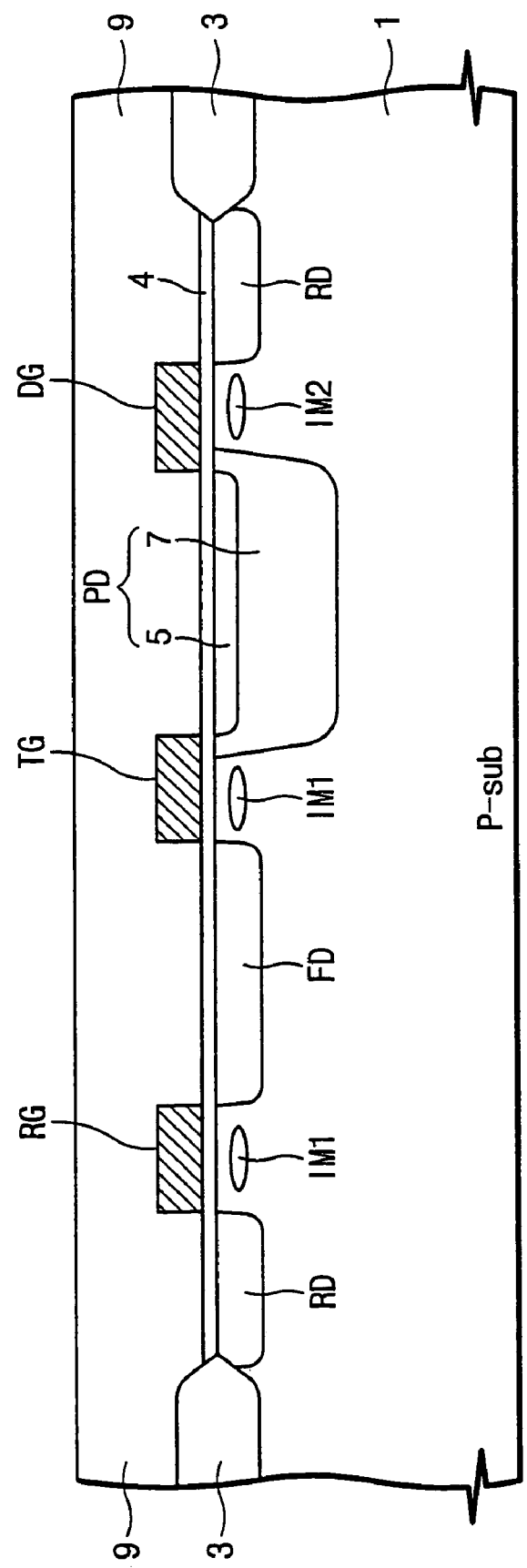
Figure 6B:
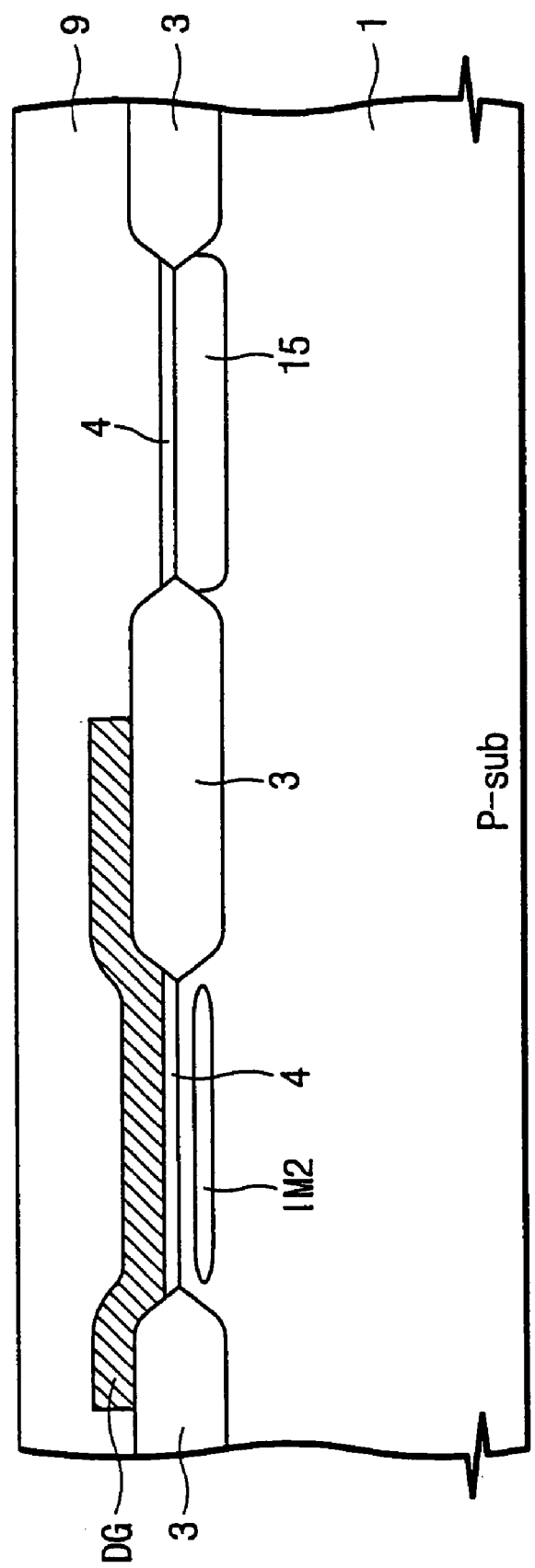

Referring to FIGS. 2, 6A and 6B, a gate conductive layer is formed on the substrate having the gate insulation layer 4. The gate conductive layer is patterned to form a transfer gate electrode TG, a reset gate electrode RG, a sensing gate electrode SG and a pull-up gate electrode PUG that cross over the second active region 3b. The transfer gate electrode TG is formed to be adjacent the first active region 3a. In more detail, in some embodiments, the transfer gate electrode TG is formed so that one edge of the transfer gate electrode TG is overlapped with an edge of the N-well region 7. Also, the reset gate electrode RG is formed to cross over the second active region 3b between the transfer gate electrode TG and the pull-up gate electrode PUG, the sensing gate electrode SG is formed to cross over the second active region between the reset gate electrode RG and the pull-up gate electrode PUG. In other embodiments, a dummy gate electrode DG crossing over the third active region 3c may be additionally formed during formation of the transfer gate electrode TG, the reset gate electrode RG, the sensing gate electrode SG and the pull-up gate electrode PUG.

The third active region 3c is connected to another second active region 3b formed in a pixel, which is adjacent to the third active region 3c. In detail, the third active region 3c is connected to the other second active region 3b between another reset gate electrode RG and another sensing gate electrode SG in the adjacent pixel. Ions of the second conductivity type are selectively implanted into the second and third active regions 3b and 3c using the gate electrode TG, RG, SG, PUG and DG as well as the isolation layer 3 as ion implantation masks, thereby forming source/drain regions of the second conductivity type, e.g., N-type source/drain regions. The source/drain region between the transfer gate electrode TG and the reset gate electrode RG corresponds to a floating diffusion region FD, and the source/drain region between the reset gate electrode RG and the sensing gate electrode SG corresponds to a reset diffusion region RD.

Ions of the first conductivity type are selectively implanted into the first and fourth active regions 3a and 3d. As a result, a P-type region 5 surrounded by the N-well region 7 is formed at the surface of the first active region 3a, and a P-type pick-up region 15 is formed at the surface of the fourth active region 3d. The N-well region 7 and the P-type region 5 constitute a photo diode PD. In some embodiments, the P-type region 5 and the P-type pick-up region 15 are formed prior to formation of the N-type source/drain regions.

The transfer gate electrode TG, the N-well region 7 and the floating diffusion region FD constitute a transfer NMOS transistor, and the reset gate electrode RG, the floating diffusion region FD and the reset diffusion region RD constitute a reset NMOS transistor. Similarly, the sensing gate electrode SG and the source/drain regions formed at both sides thereof constitute a sensing NMOS transistor, and the pull-up gate electrode PUG and the source/drain regions formed at both sides thereof constitute a pull-up NMOS transistor. Also, the N-well region 7, the dummy gate electrode DG and the reset diffusion region RD adjacent to the dummy gate electrode DG constitute a bypass NMOS transistor. In embodiments where the dummy gate electrode DG is not formed, ions are not implanted into the third active region 3c during the formation of the N-type source/drain regions, the P-type region 5 and the P-type pick-up region 15. An interlayer insulation layer 9 is formed on the substrate having the source/drain regions, the impurity region 5 and the pick-up region 15.

Figure 7A:
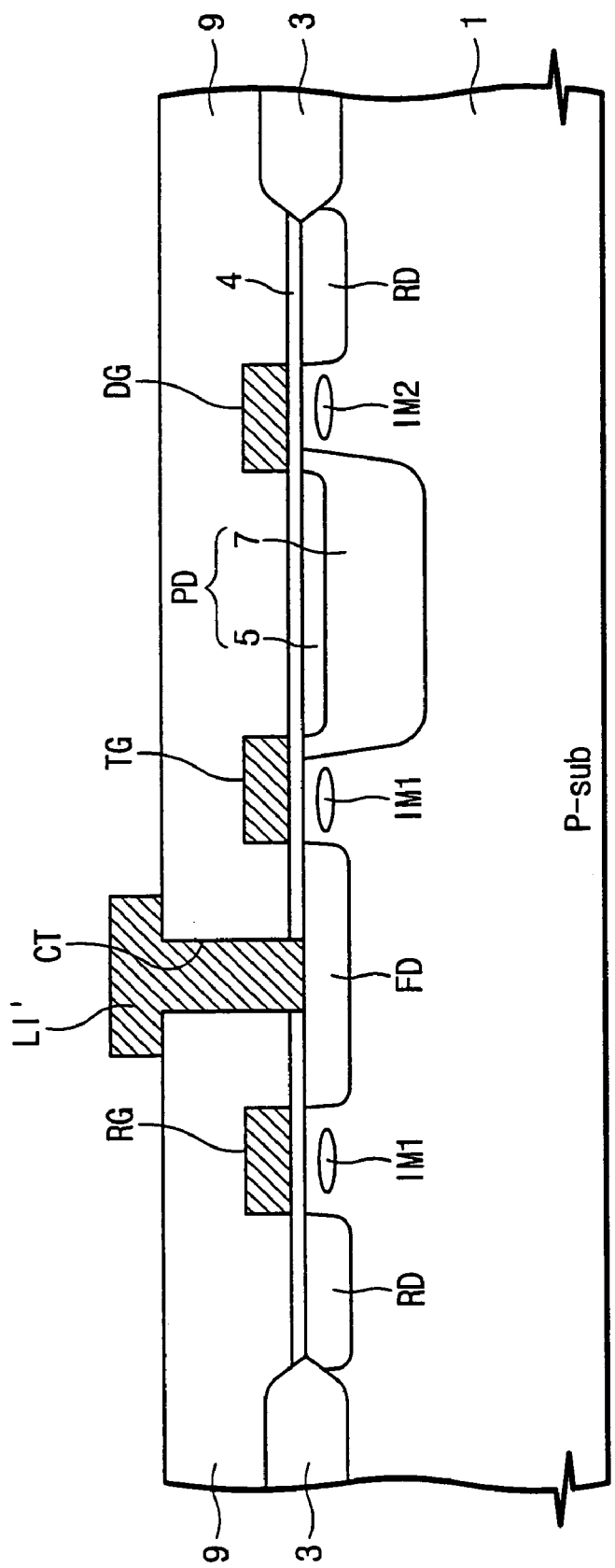
Figure 7B:
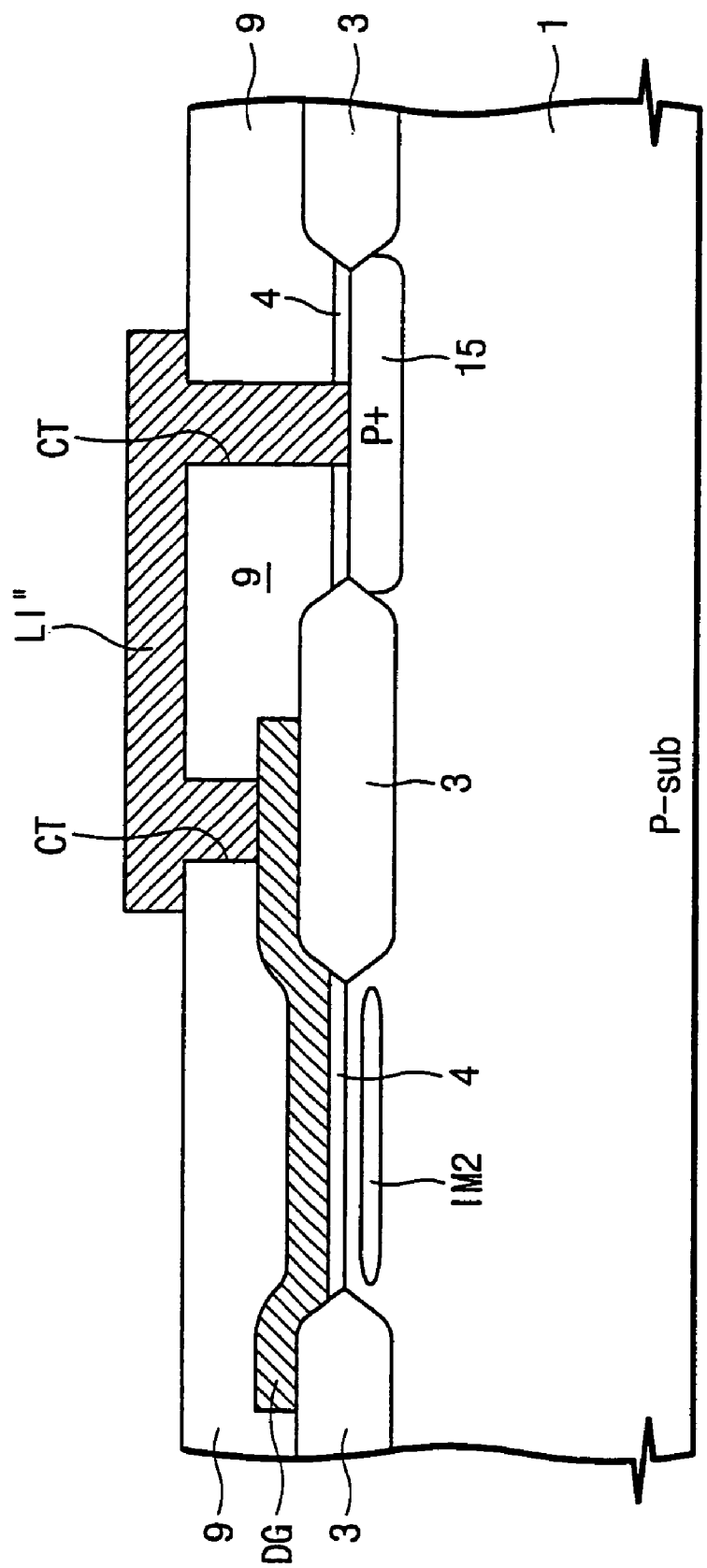

Referring to FIGS. 2, 7A and 7B, the interlayer insulation layer 9 is patterned to form contact holes CT that expose the sensing gate electrode SG and the floating diffusion region FD. In some embodiments, the dummy gate electrode DG and the pick-up region 15 may be also exposed by the contact holes CT. A conductive layer is formed on the substrate having the contact holes CT. The conductive layer is patterned to form a first local interconnection LI' on the interlayer insulation layer 9. The first local interconnection LI' electrically connects the sensing gate electrode SG with the floating diffusion region FD through the contact holes CT. Further, a second local interconnection LI" may be additionally formed on the interlayer insulation layer 9 during formation of the first local interconnection LI'. The second local interconnection LI" electrically connects the dummy gate electrode DG with the pick-up region 15 through the contact holes CT.

According to some embodiments of the present invention as described above, the photodetector in the respective pixels is connected to the bypass device. Thus, at least some excess charge generated in the photodetector flows into the power supply through the bypass device. Therefore, the blooming phenomenon and/or malfunction of the image sensor can be reduced or suppressed.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating an image sensor, comprising:
   forming an isolation layer in a semiconductor substrate to define a first active region, a second active region that extends from the first active region and a third active region that extends from the first active region;
   forming a well region of a second conductivity type in the first active region;
   forming a region of a first conductivity type in the well region, at a surface of the first active region;
   forming a transfer transistor, a reset transistor, a sensing transistor and a pull-up transistor serially connected to the well region in the second active region, the transfer transistor being adjacent to the first active region, the transfer transistor, the reset transistor, the sensing transistor and the pull-up transistor including a transfer gate electrode, a reset gate electrode, a sensing gate electrode and a pull-up gate electrode that cross over the second active region respectively;
   forming an interlayer insulation layer on the substrate having the transistors;
   patterning the interlayer insulation layer to form contact holes that expose the sensing gate electrode as well as the second active region between the transfer gate electrode and the reset gate electrode; and
   forming a first local interconnection on the interlayer insulation layer, the first local interconnection electrically interconnecting the sensing gate electrode with the second active region between the transfer gate electrode and the reset gate electrode through the contact holes.

2. The method of claim 1, wherein the first and second conductivity types are P-type and N-type respectively, the transfer transistor, the reset transistor, the sensing transistor and the pull-up transistor being N-channel MOS transistors.

3. The method of claim 1 further comprising applying a first ion implantation process and a second ion implantation process to the second active region and the third active region respectively, prior to formation of the transfer transistor, the reset transistor, the sensing transistor and the pull-up transistor, wherein the second active region that is formed with the first ion implantation process has a higher potential level than the third active region that is formed with the second ion implantation process.

4. The method of claim 1 further comprising forming a dummy gate electrode that crosses over the third active region, the dummy gate electrode being formed during formation of the transfer gate electrode, the reset gate electrode, the sensing gate electrode and the pull-up gate electrode.

5. The method of claim 4 further comprising defining a fourth active region that is separated from the first to third active regions, wherein the fourth active region is defined during formation of the isolation layer, the fourth active region being doped P-type, the dummy gate electrode and the fourth active region being exposed during formation of the contact holes, the exposed dummy gate electrode and the exposed fourth active region being electrically connected to each other by a second local interconnection that is formed on the interlayer insulation layer during formation of the first local interconnection.

* * * * *